United States Patent [19]

Engler et al.

[11] 4,312,935
[45] Jan. 26, 1982

[54] CLASS OF E-BEAM RESISTS BASED ON CONDUCTING ORGANIC CHARGE TRANSFER SALTS

[75] Inventors: Edward M. Engler, Wappingers Falls; John D. Kuptsis; Robert G. Schad, both of Yorktown Heights; Yaffa Tomkiewicz, Katonah, all of N.Y.

[73] Assignee: International Business Machines Corporation, Armonk, N.Y.

[21] Appl. No.: 213,968

[22] Filed: Dec. 8, 1980

Related U.S. Application Data

[62] Division of Ser. No. 65,291, Aug. 9, 1979.

[51] Int. Cl.$^3$ .............................................. G03C 5/04
[52] U.S. Cl. ................................... 430/296; 430/325; 430/270; 430/311; 430/313; 430/321; 430/339; 430/344; 430/338
[58] Field of Search ............... 430/296, 325, 311, 313, 430/321, 270, 495, 339, 344, 541, 338

[56] References Cited

U.S. PATENT DOCUMENTS

| | | | |
|---|---|---|---|
| 3,425,867 | 2/1969 | Stillo | 430/296 |
| 3,671,250 | 6/1972 | Andrews et al. | 430/541 |
| 3,690,889 | 9/1972 | Harrison et al. | 430/338 |
| 3,697,528 | 10/1972 | Andrews et al. | 430/270 |
| 3,736,142 | 5/1973 | Kaspaul et al. | 430/541 |
| 3,779,806 | 12/1973 | Gipstein et al. | 430/296 |
| 4,036,648 | 7/1977 | Engler et al. | 430/344 |

*Primary Examiner*—Won H. Louie, Jr.
*Attorney, Agent, or Firm*—Hansel L. McGee

[57] ABSTRACT

Novel E-beam resists and process for their use are described. These resists are conducting organic charge transfer salts. Films of these materials can be deposited by solvent casting or by sublimation. The deposited film can be made to produce a positive or negative resist image depending on the E-beam energy and exposure time. Exposure of this material to an E-beam produces patterns having differential electrical, optical and solvation properties.

36 Claims, No Drawings

CLASS OF E-BEAM RESISTS BASED ON CONDUCTING ORGANIC CHARGE TRANSFER SALTS

This is a division of application Ser. No. 065,291 filed Aug. 9, 1979.

BACKGROUND OF THE INVENTION

1. Field of the Invention

The invention lies in the field of electron beam resist compositions and the production of patterned thin film layers thereof.

2. Prior Art

The prior art is replete with radiation sensitive materials as resists and with their use in pattern formation in the fabrication of microelectronic devices. In the prior art, pattern formation in these materials is dependent upon differential solubility between irradiated and unirradiated regions. These solubility changes are produced by either bondbreaking, (chain scission) or bond formation (chain crosslinking) in polymeric systems. This occurs in the presence of actinic radiation, E-beam radiation or X-ray radiation.

The prior art materials have several drawbacks among which is the difficulty of obtaining sharp images of high resolution, particularly in negative resists. This is due to the swelling of the polymeric material during solvent development. Films of prior art materials are generally insulative in nature and as such tend to buildup static charges on their surfaces during irradiation. In the prior art this problem is overcome by the deposition of a thin metal film on top of the polymeric resist material. In addition it is difficult to produce films of uniform thickness by solvent coating techniques on surfaces with topography.

The state of the art in electron-beam lithography can be readily reviewed in a review entitled "CRC Critical Reviews" by M. J. Bowden, Solid State and Material Sciences, 8, 223 (1979).

SUMMARY OF THE INVENTION

What has been discovered here are novel electron-beam resists which can be broadly classified as conducting organic charge transfer salts. More specifically, the materials can be selected from the halogen salts of tetrathiafulvalene (TTF) and its derivatives, its selenium analog tetraselenafulvalene (TSeF) and its derivatives, tetraheterotetracenes, tetramethylphenylenediamines, phthalocyanines, porphyrins and derivatives of these π-donors. The halogen can be selected from iodine, bromine and chlorine.

In another embodiment there is described a method for providing a positive resist image using a film of one of the above compounds.

In yet another embodiment a method for providing a negative resist image is provided.

DESCRIPTION OF THE INVENTION

The present invention teaches novel electron-beam resist materials which can be used to provide either a positive or negative resist image depending upon irradiation energy parameters. Principally, the materials can be selected from several classes of conducting organic π-donor complexes. For example, they can be selected from tetraheterofulvalenes and derivatives thereof having the general structural formula

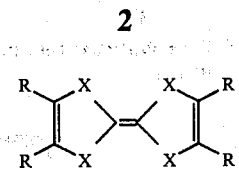

where X is S and/or Se, and R=H, alkyl such as CH₃, C₂H₅ tetraheterotetracenes and derivatives thereof having the general structural formula

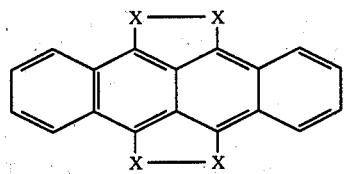

where X is S and/or Se; tetraheteronaphthalene and derivatives thereof having the general structural formula

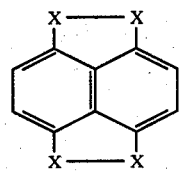

where X is S and/or Se;
perylene and derivatives thereof having the general structural formula,

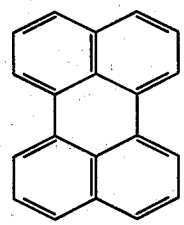

biheteropyrans and derivatives thereof having the general structural formula

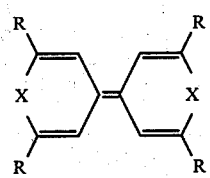

where X is S and or Se, or N-alkyl and R is alkyl, phenyl
tetramethylphenylenediamine and derivatives thereof having the general structural formula

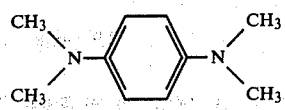

phthalocyanines and derivatives thereof having the general structural formula

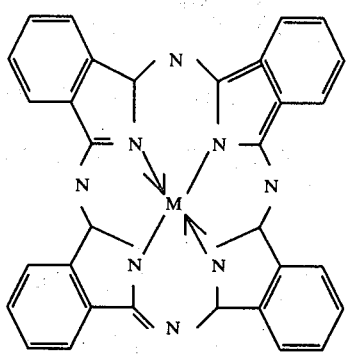

where M is a transition metal, e.g., Ni, Cu, Fe, Co, Pt, and the like
and porphyrins and derivatives thereof having the general structural formula

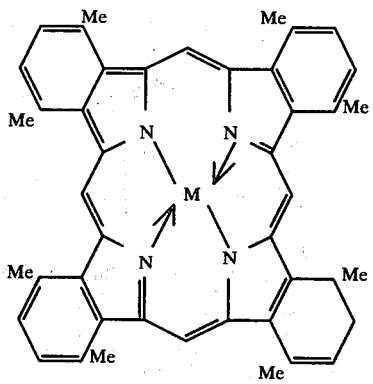

where M is a transition metal

The above π-donor compositions form conducting charge transfer compositions in the presence of a halogen according to the following equation:

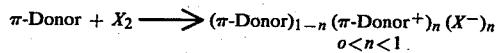

$$\pi\text{-Donor} + X_2 \longrightarrow (\pi\text{-Donor})_{1-n}(\pi\text{-Donor}^+)_n(X^-)_n$$
$$o < n < 1$$

X can be Cl, Br or I.

It is well known that to achieve high conductivity the stoichiometry (i.e. n in the above equation) of the charge transfer salt must be less than one. Also, the value of n can be usually varied over a range of values between 0 and 1 without significantly changing the conducting properties.

The above π-donors have been found to be the basis of a new lithographic process. This process is based on the discovery that exposure of the charge transfer salt to an electron beam having sufficient current density causes the loss of the halogen in the charge transfer salt where it is irradiated. That is, the electron-beam causes a reverse charge transfer reaction to occur as in the following equation:

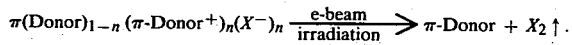

$$\pi(\text{Donor})_{1-n}(\pi\text{-Donor}^+)_n(X^-)_n \xrightarrow{\text{e-beam irradiation}} \pi\text{-Donor} + X_2\uparrow$$

In general these charge transfer salts can be deposited by sublimation. They give smooth, adherent and glass-like films. Films having uniform thickness in the range of about 3000 angstroms to about 2 microns or more have been deposited. In cases where the salt has a low vapor pressure or is thermally unstable, films can be formed by solution coating techniques.

It was further discovered here that these materials can be made to provide either negative or positive resist images. The imaging mode depends upon the parameters of the electron-beam, e.g., its energy, and charge density. For example, in the case for negative images, the electron-beam is in a range of from about 5 KeV to about 30 KeV. The charge density is at least in the $10^{-4}$ to $10^{-3}$ c/cm² range. The exposure is performed at room temperature. The images are developed in suitable polar solvents such as short chain alcohols, water, dimethylformamide, dimethylsulfoxide, acetonitrile and the like.

The negative image undergoes crosslinking and gives desirable patterns which are unchanged in hot solvents. For example, when a negative image was formed on a film of tetrathiafulvalene bromide the image was subjected to boiling chlorobenzene, dimethylsulfoxide and the like without change. The image was also subjected to temperatures of 275° C. in vacuum at $10^{-6}$ torr and again without change. These images undergo lift-off readily when treated with aqueous hydrazine for about 1-2 minutes at room temperature. Negative resist images having dimensions of less than 1 micron, with excellent edge definition of about 0.1 micron, and near vertical walls have been obtained. No swelling occurred in the images when washed in a wide variety of polar and non-polar solvents.

Positive resist images can be prepared either in situ or by solvent development. In the in situ mode the resist is exposed to electron-beam radiation having charge density in the $10^{-3}$ to $10^{-1}$ coul/cm² range and an energy of from about 5 KeV to about 30 KeV. At these charge densities levels the exposed resist materials are caused to sublime. This sublimation can be enhanced by heating the substrate upon which the resist lies to temperatures in the range of about 60° C. to about 100° C.

Solvent developed positive images are obtained in those instances where the charge transfer salts do not readily crosslink upon exposure after halogen loss. That halogen loss is effected upon exposure is ascertained by electron microprobe techniques. The exposed materials are readily removed with low polarity solvents such as methylene chloride, chlorform, carbon tetrachloride and the like. The advantage of the solvent development is that in principle more sensitive positive resists can be obtained. An additional feature of solvent development is that less volatile donors used in the image coating process.

Another discovery of the invention disclosed is the different electrical and optical properties between exposed and unexposed materials of the invention. It was known that the unexposed films were highly conductive having conductivities in the range of from about 0.1 to about 20/ohm-cm. This conductivity is of practical advantage because it eliminates static charge build up in the film during irradiation. With prior insulating polymer resists, this problem required that a thin metal layer be deposited on the resist. With the present materials this requirement no longer exist. While the unexposed resist exhibits conductivity, the exposed resist is found to be insulating. For example, when a film of tetrathiafulvalene bromide is sublimed onto a substrate and its conductivity measured, and compared with the conductivity of the developed electron-beam negative image, it was found that there was change in conductivity of over 8 orders of magnitude. The unexposed resist exhibited a conductivity of 20/ohm-cm, while the exposed regions exhibited a conductivity of less than $10^{-7}$/ohm-cm.

It has also been observed that large optical property changes occur in the exposed part of the resist. It is observed that the unexposed resist films strongly absorb light in the visible and near infrared, while the exposed films are non-absorbing in these regions. For example, it is found that films of tetrathiafulvalene bromide have strong absorptions at 5500 Å and at 3800 Å. After irradiation, optical measurements disclosed that these absorptions were absent in the exposed regions. It should be noted that development is not necessary to optically detect electron-beam written patterns on the subject films. Optical absorption is, of course, dependent upon composition. For example, charge transfer salts such as tetrathiatetracene and tetraphenyl dithiopyran are strongly absorbing in the 8000 Å to 8500 Å region. This light absorbing difference in unexposed versus exposed materials lend applications to optical masks and in video storage devices.

The sensitivity of the lithographic process as well as the optical and electrical properties of the present resists are dependent upon respective halogen content and the electron-beam parameters.

Improvement in the sensitivity of the reverse charge transfer reaction have been seen in going from tetrathiafulvalene bromide to the chloride salt. This improved the sensitivity by over a factor of 5. In another example, a film of the neutral donor is deposited and than treated with halogen transfer salt with a smaller molar content of halogen. Electron-beam irradiation of this material therefor has to remove less halogen and leads to corresponding enhancement in sensitivity.

The following examples are by way of illustration and not by way of limitation.

EXAMPLE 1

A film of tetrathiafulvalene bromide of (TTF-$Br_n$) about 5000 Å thick is prepared by vacuum subliming TTF-$Br_n$ at a pressure of 1 micron and a temperature of 185° C. to about 190° C. Sublimation is continued for about 10 minutes. Analysis of the thus produced film shows a non-stoichiometric composition of TTF-$Br_{0.78}$.

An image is formed on the film by impinging an electron-beam thereon in a predetermined pattern. The electron-beam had a current density of about $10^{-4}$ coulomb/$cm^2$ and an energy of 10 KeV. The film is then washed with methanol for about 15 seconds at room temperature to remove the unexposed areas of the film. A negative resist image remained having dimensions less than 1 micron.

The image is unchanged after boiling in chlorobenzene or dimethylsulfoxide and on heating to 275° C. in vacuum. It is removed however, when it is washed with aqueous hydrazine for about 1-2 minutes at room temperature.

Optical absorption as well as conductivity measurements were made on the film prior and subsequent to exposure. Prior to exposure the film disclosed the characteristic TTF-Br salt absorptions at 5500 A and 3800 A. After exposure these absorptions were absent. Similarly, the conductivity of the film was 20/ohm-cm prior to exposure and was found to be less than $10^{-7}$/ohm-cm subsequently.

EXAMPLE 2

A film of TTF-$Br_{0.78}$ is prepared as in Example 1. The film is irradiated in a predetermined pattern with a electron-beam having a current density of about $10^{-3}$ coulomb/$cm^2$ and an energy of 10 KeV. After irradiation it is found that the exposed film is removed leaving a positive resist image. The image exhibited dimensions of less than one micron with near vertical walls. Further development is not required.

EXAMPLE 3

A film of tetrathiafulvalene chloride (TTF-$Cl_{0.65}$) is prepared as in Example 1 except that a bath temperature of 195° C. to 205° C. is used. The stoichiometry of the film is found to be TTF-$Cl_{0.65}$. The film is irradiated and subsequently treated as in Example 1 to effect a negative image. It is found that the solubility, optical and electrical properties are similar to the film deposited in Example 1. It is further found that the TTF-$Cl_{0.65}$ proves to be about 5 times more sensitive than the TTF-$Br_{0.78}$ film of Example 1.

EXAMPLE 4

A film of TTF-$Cl_{0.65}$ is prepared as in Example 3 and is irradiated and treated as in Example 2. A positive resist image obtained without solvent development. The image has dimensions of less than 1 micron with almost vertical walls.

EXAMPLE 5

A film of tetrathiafulvalene iodide (TTF-$I_n$) is prepared by the procedure disclosed in Example 1 except that a heating temperature of about 140° C. to about 150° C. is used. Analysis of the film discloses a stoichiometry of TTF-$I_{0.7}$. The film is irradiated and subsequently treated as the analogous films of Examples 1 and 2 to produce both negative and positive resist images respectively. The solubility, optical and electrical properties are very similar to the films produced in Examples 1 and 2.

EXAMPLE 6

A film of tetraselenafulvalene bromide (TSeF-$Br_n$) is prepared as in Example 1 to give a film composition of TSeF-$Br_{0.8}$. This film is irradiated and subsequently treated as in Examples 1 and 2 to give both negative and positive resist images respectively. Optical measurements discloses that the unexposed film have strong absorptions at 4300 Å and 6500 Å. Similar changes in solubility, optical and electrical properties as disclosed in Example 1 are observed.

EXAMPLE 7

Tetrathiatetracene (TTT) is sublimed in vacuum at 1 micron and 350° C. to give a neutral TTT film. The film is then exposed to bromine vapor for about 10 mins. to provide a conducting film having a stoichiometry of TTT-$Br_{0.1}$. The film is irradiated and treated in the manner given in Examples 1 and 2 to obtain negative and positive resist images which exhibit similar electrical changes as in the previous Examples.

Halogen salts of the following materials similarly can be used as electron-beam resist and treated in a manner similar to that disclosed in the above examples.

diselenadithiafulvalene dimethyltetrathiafulvalene
dimethyltetraselenafulvalene
dimethyldiselenadithiafulvalene
tetramethyltetrathiafulvalene
tetramethyltetraselenafulvalene
tetramethyldiselenadithiafulvalene
hexamethylenetetrathiafulvalene
hexamethylenetetraselenafulvalene
hexamethylenediselenadithiafulvalene
tetrathianaphthalene
tetraselenaphthalene
tetrathianaphthalene
tetraselenanaphthalene
perylene
dithiopyran
tetramethyldithiopyran
tetraphenyldithiopyran
diselenapyran
tetramethyldiselenapyran
tetraphenyldiselenapyran
dipyran
tetramethylphenylenediamine
phthalocyanine
nickel phthalocyanine
copper phthalocyanine
cobalt phthalocyanine
iron phthalocyanine
octamethyltetrabenzporphyrins
nickel octamethyltetrabenzporphyrins The above listing of materials is not meant to indicate that the scope of the invention should be limited thereby. One skilled in the art would know the list not to be exhaustive but that many other compounds derived from those listed above and throughout the specification can also be used in the furtherance of the present invention.

The invention hereinabove described includes a novel class of resist materials which can be generally classified as conducting organic charge transfer salts. These materials can give rise to both negative and positive resists merely by controlling the irradiation parameters, i.e., energy and current density. The resists have other advantages including large changes in solubility, optical and electrical properties which result upon irradiation. These properties lead to their usefulness in the fabrication of microstructures for large scale integration of electronic circuits, as optical storage media, for fabricating master masks used in photolithography and in eliminating static charging in the resist during electron or ion bombardment.

Having thus described our invention, what we claim as new, and desire to secure by Letters Patent is:

1. A method for forming negative resist images including the steps of:
    (a) applying onto a substrate a uniform solid film of a conducting organic charge transfer material selected from the group consisting of halogen salts of; tetrathiafulvalene and its alkyl derivatives, tetraselenafulvalene and its alkyl derivatives, tetrathiatetracenes, tetraselenatetracenes, dithiadiselenatetracenes, tetramethylphenylenediamine, tetraselenanaphthalene, tetrathianaphthalene, dithiadiselenanaphthalene, dithiopyran, tetramethyldithiopyran, tetraphenyldithiopyran, diselenapyran, tetramethyldiselenapyran, tetraphenyldiselenapyran, dipyran, phthalocyanines and porphyrins and wherein said halogen is selected from chlorine bromine and iodine, and
    (b) exposing said film to an electron-beam in a predetermined pattern, said electron-beam having sufficient energy and current density to cause crosslinking in exposed areas of said film; and
    (c) treating the unexposed areas of said film with a solvent to remove said areas whereby a negative image is formed.

2. A method according to claim 1 wherein said electron-beam has an energy of about 5 KeV to about 30 KeV and a current density of at least $10^{-4}$ coulombs/cm$^2$.

3. A method according to claim 1 wherein said conducting organic charge transfer material is a halogen salt of tetrathiafulvalene.

4. A method according to claim 1 wherein said conducting organic charge transfer material is a halogen salt of tetraselenafulvalene.

5. A method according to claim 1 wherein said conducting organic charge transfer material is a halogen salt of tetrathiatetracene.

6. A method according to claim 1 wherein said conducting organic charge transfer material is a halogen salt of diselenadithiafulvalene.

7. A method according to claim 1 wherein said conducting organic charge transfer material is a halogen salt of dimethyltetrathiafulvalene.

8. A method according to claim 1 wherein said conducting organic charge transfer material is a halogen salt of dimethyltetraselenafulvalene.

9. A method according to claim 1 wherein said conducting organic charge transfer material is a halogen salt of dimethyldiselenadithiafulvalene.

10. A method according to claim 1 wherein said conducting organic charge transfer material is a halogen salt of tetramethyltetrathiafulvalene.

11. A method according to claim 1 wherein said conducting organic charge transfer material is a halogen salt of tetramethyltetraselenafulvalene.

12. A method according to claim 1 wherein said conducting organic charge transfer material is a halogen salt of tetramethyldiselenadithiafulvalene.

13. A method according to claim 1 wherein said conducting organic charge transfer material is a halogen salt of hexamethylenetetrathiafulvalene.

14. A method according to claim 1 wherein said conducting organic charge transfer material is a halogen salt of hexamethylenetetraselenafulvalene.

15. A method according to claim 1 wherein said conducting organic charge transfer material is a halogen salt of hexamethylenediselenadithiafulvalene.

16. A method according to claim 1 wherein said conducting organic charge transfer material is a halogen salt of tetrathianaphthalene.

17. A method according to claim 1 wherein said conducting organic charge transfer material is a halogen salt of tetraselenanaphthalene.

18. A method according to claim 1 wherein said conducting organic charge transfer material is a halogen salt of diselenadithianaphthalene.

19. A method according to claim 1 wherein said conducting organic charge transfer material is a halogen salt of tetraselenatetracene.

20. A method according to claim 1 wherein said conducting organic charge transfer material is a halogen salt of perylene.

21. A method according to claim 1 wherein said conducting organic charge transfer material is a halogen salt of dithiopyran.

22. A method according to claim 1 wherein said conducting organic charge transfer material is a halogen salt of tetramethyldithiopyran.

23. A method according to claim 1 wherein said conducting organic charge transfer material is a halogen salt of tetraphenyldithiopyran.

24. A method according to claim 1 wherein said conducting organic charge transfer material is a halogen salt of diselenapyran.

25. A method according to claim 1 wherein said conducting organic charge transfer material is a halogen salt of tetramethyldiselenapyran.

26. A method according to claim 1 wherein said conducting organic charge transfer material is a halogen salt of tetraphenyldiselenapyran.

27. A method according to claim 1 wherein said conducting organic charge transfer material is a halogen salt of dipyran.

28. A method according to claim 1 wherein said conducting organic charge transfer material is a halogen salt of tetramethylphenylenediamine.

29. A method according to claim 1 wherein said conducting organic charge transfer material is a halogen salt of phthalocyanine.

30. A method according to claim 1 wherein said conducting organic charge transfer material is a halogen salt of nickel phthalocyanine.

31. A method according to claim 1 wherein said conducting organic charge transfer material is a halogen salt of copper phthalocyanine.

32. A method according to claim 1 wherein said conducting organic charge transfer material is a halogen salt of cobalt phthalocyanine.

33. A method according to claim 1 wherein said conducting organic charge transfer material is a halogen salt of iron phthalocyanine.

34. A method according to claim 1 wherein said conducting organic charge transfer material is a halogen salt of octamethyltetrabenzporphyrins.

35. A method according to claim 1 wherein said conducting organic charge transfer material is a halogen salt of nickel octamethyltetrabenzporphyrins.

36. A method according to claim 1 wherein said conducting organic charge transfer material is a halogen salt of diselenadithiatetracene.

* * * * *